(12) United States Patent
Fantini

(10) Patent No.: US 12,045,712 B2
(45) Date of Patent: Jul. 23, 2024

(54) SELF SELECT MEMORY CELL BASED ARTIFICIAL SYNAPSE

(71) Applicant: Micron Technology, Inc., Boise, ID (US)

(72) Inventor: Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/114,587

(22) Filed: Feb. 27, 2023

(65) Prior Publication Data

US 2023/0206039 A1 Jun. 29, 2023

Related U.S. Application Data

(63) Continuation of application No. 16/549,958, filed on Aug. 23, 2019, now Pat. No. 11,593,624.

(51) Int. Cl.
*G06N 3/04* (2023.01)
*G06N 3/049* (2023.01)
*G06N 3/06* (2006.01)
*G06N 3/063* (2023.01)

(52) U.S. Cl.
CPC ............. *G06N 3/049* (2013.01); *G06N 3/063* (2013.01)

(58) Field of Classification Search
CPC ................ G06N 3/049; G06N 3/063
See application file for complete search history.

(56) References Cited

U.S. PATENT DOCUMENTS

| | | | |
|---|---|---|---|
| 8,682,822 B2 | 3/2014 | Modha et al. | |
| 9,117,550 B2* | 8/2015 | Tran ................... | H01L 23/4952 |
| 9,830,982 B2 | 11/2017 | Kim et al. | |
| 2010/0155692 A1* | 6/2010 | Tran ....................... | G11C 13/04 |
| | | | 977/734 |
| 2010/0290265 A1 | 11/2010 | Agarwal et al. | |
| 2014/0122402 A1 | 5/2014 | Bichler et al. | |
| 2014/0172762 A1 | 6/2014 | Suri et al. | |
| 2015/0006455 A1 | 1/2015 | Suri et al. | |
| 2016/0203400 A1 | 7/2016 | Kim et al. | |
| 2018/0012123 A1 | 1/2018 | Han et al. | |
| 2019/0164600 A1 | 5/2019 | Castro | |
| 2019/0189206 A1 | 6/2019 | Tortorelli et al. | |

(Continued)

FOREIGN PATENT DOCUMENTS

JP 2018508922 A 3/2018

OTHER PUBLICATIONS

Chen, "A Review of Emerging Non-Volatile Memory (NVM) Technologies and Applications", Jul. 30, 2016, Solid-State Electronics, vol. 125, pp. 25-38. (Year: 2016).*

(Continued)

*Primary Examiner* — Paulinho E Smith
(74) *Attorney, Agent, or Firm* — Brooks, Cameron & Huebsch, PLLC

(57) ABSTRACT

Apparatuses and methods for implementing artificial synapses utilizing SSM cells. A leaky-integrate-and-fire circuit can provide a feedback signal to an SSM cell responsive to a threshold quantity of pulses being applied to the gate from the signal line. A resulting state of the SSM cell can be dependent on a time difference between a latest of the threshold quantity of pulses and an initial pulse of the feedback signal.

20 Claims, 7 Drawing Sheets

(56) References Cited

U.S. PATENT DOCUMENTS

2020/0410319 A1* 12/2020 Pellizzer .............. G11C 7/1006

OTHER PUBLICATIONS

Ambrogio et al.—"Unsupervised Learning by Spike Timing Dependent Plasticity in Phase Change Memory (PCM) Synapses", Mar. 8, 2016, Frontiers in Neuroscience, vol. 10 Article 56, pp. 1-12. (Year: 2016).*

Ambrogio, et al., "Unsupervised Learning by Spike Timing Dependent Plasticity in Phase Change Memory (PCM) Synapses", vol. 10, Article 56, Mar. 8, 2016, 12 pages.

Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.

Poggio, et al., "Leaky Integrate and Fire", MIT OpenCourseWare paper, retrieved from https://ocw.mit.edu, Jun. 26, 2019, 7 pages.

International Search Report and Written Opinion from related International Application No. PCT/US2020/041117, dated Oct. 26, 2020, 12 pages.

Chen, "A Review of Emerging Non-Volatile Memory (NVM) Technologies and Applications", Jul. 30, 2016, Solid-State Electronics, vol. 125, pp. 25-38.

\* cited by examiner

US 12,045,712 B2

SELF SELECT MEMORY CELL BASED ARTIFICIAL SYNAPSE

PRIORITY INFORMATION

This application is a Continuation of U.S. application Ser. No. 16/549,958, filed on Aug. 23, 2019, the contents of which are incorporated herein by reference.

TECHNICAL FIELD

The present disclosure relates generally to memory, and more particularly to apparatuses and methods associated with implementing an artificial synapse utilizing self-selecting memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Various computing systems include a number of processing resources that are coupled to memory (e.g., a memory system), which is accessed in association with executing a set of instructions (e.g., a program, applications, etc.). The processing resources can execute instructions to perform artificial intelligence (AI). The processing resources may be dedicated to perform AI. AI can include learning and/or problem solving. For instance, AI can be characterized by the ability to problem solve and to learn such that the rate of success of problem solving increases over time and/or over the examples identified. AI can also include the ability to perceive an environment corresponding to a problem being solved. For instance, AI can be used to identify features of an image. The successes and failures of identification can be used to improve the success rate of feature identification.

DETAILED DESCRIPTION

Figure 1:
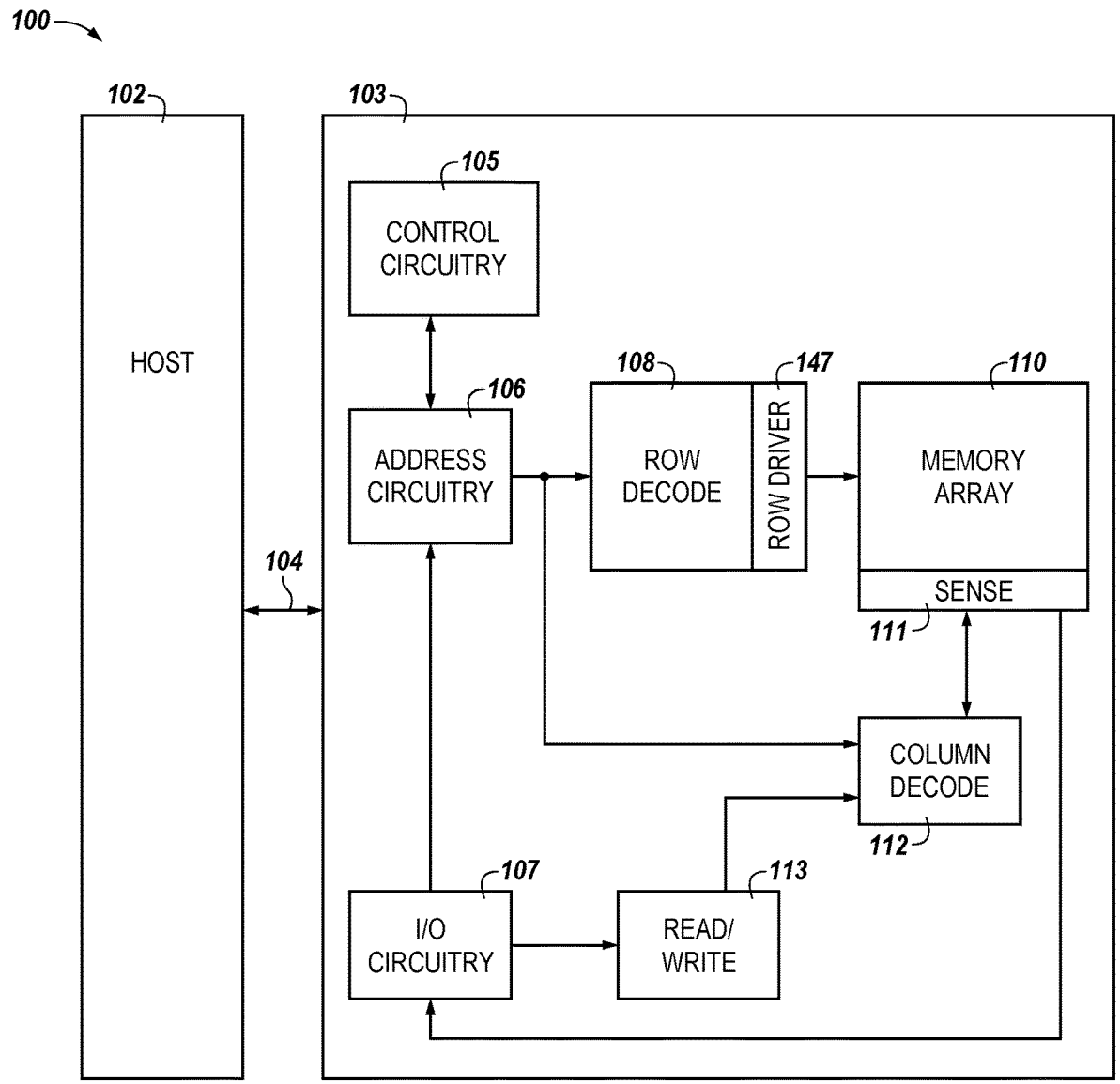
FIG. 1 is a block diagram of an apparatus in the form of a computing system including a memory device in accordance with a number of embodiments of the present disclosure.

The present disclosure includes apparatuses and methods related to implementing artificial synapses with self-selecting memory (SSM) cells. In some examples, a leaky-integrate-and-fire circuit can be configured to provide a feedback signal to an SSM cell responsive to a threshold quantity of pulses being applied to a gate of a transistor coupled to the SSM cell, wherein the threshold quantity of pulses are provided from a signal line coupled to the gate. A resulting state of the SSM cell can be dependent on a time difference between a latest of the threshold quantity of pulses and an initial pulse of the feedback signal.

Neuromorphic computing architecture includes the mimicking of neuro-biological architectures present in a biological nervous system utilizing hardware and/or software. Neuromorphic computing architecture can include a multilayer neuron architecture referred to as perceptron. A neuron in a multilayered neuron architecture of a neuromorphic computing architecture can be referred to as an artificial neuron. An artificial neuron can combine one or more inputs received to produce an output. As used herein, the term "artificial" denotes circuitry configured to represent biological systems. For example, an artificial neuron can include circuitry configured to mimic and/or perform the functions of a biological neuron.

The outputs of a first artificial neuron can be propagated to a second artificial neuron utilizing an artificial synapse. An artificial synapse can facilitate interneuron connections and may comprise reconfigurable weights. In a number of examples, the artificial synapses may be implemented utilizing an SSM cell. The SSM cell can store the reconfigurable weights.

Implementing artificial synapses utilizing SSM cells can provide for a reduction in power consumption as compared to utilizing different resistors or other types of memory cells in artificial synapses. A contribution to energy dissipation may originate from the pre-synapse artificial neuron (PRE) spike events that induce a current spike. The use of set transitions and/or reset transitions of an SSM cell presents low current leakage as compared to the use of different resistors or memory cells in artificial synapses. The low current leakage can lead to values of energy consumption that are lower than those obtained utilizing phase change memory (PCM) and/or resistive RAM (RRAM). SSM cells can be implemented in a dense cross-bar memory array utilizing parallelism and energy efficiency, which enables the use of an SSM cell to mimic biological neuromorphic computing architectures. The use of SSM cells to represent synapses also accentuates the binary functionality of synapses given that SSM is intrinsically binary. For example, utilizing phase change memory (PCM) in artificial synapses complicates the binary functionality of artificial synapses given that PCM accommodates multiple levels of voltage thresholds.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 120. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU). The host 102 can also be an AI chip configured for AI processing.

In the example shown in FIG. 1, the host 102 is responsible for executing an operating system (OS) and/or various applications (e.g., AI processes) that can be loaded thereto (e.g., from memory device 103 via controller 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be an SSM array, for instance. The array 110 can comprise memory cells arranged in rows coupled by access lines (which may be referred to in the art as word lines or select lines) and columns coupled by sense lines (which may be referred to in the art as digit lines, data lines, or bit lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, cache coherent interconnect for accelerators (CCIX), or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device.

In some examples, the memory array 110 can be configured to represent a neuromorphic computing architecture. The neuromorphic computing architecture can be implemented utilizing SSM cells. An SSM cell is a memory cell comprising a single chalcogenide material to operate as a selection component and a storage component.

Upon accessing, a memory cell may be read, or sensed, by a sense component 111 to determine the programmed state of the memory cell. For example, a voltage may be applied to a memory cell (using the corresponding access line and sense line) and the presence of a resulting current through the memory cell may depend on the applied voltage and the threshold voltage of the memory cell. By assessing the voltage that resulted in current flow, the logic state of the memory cell may be determined.

The artificial synapses may further include one or more transistors in addition to the SSM cell. A transistor or transistors discussed herein may be a field-effect transistor (FET) and comprise a three terminal device including a source, drain, and gate, among other types of transistors.

Various memory cells of the memory device 103 may be grouped into memory units that are configured to store a weight (e.g., a neural memory unit). The memory controller may be coupled to the neural memory unit and referred to as a neural memory unit controller. The neural memory units may be configured to mimic neuro-biological architectures. The neural memory units may leverage properties of chalcogenide material within a memory cell to change the properties of the chalcogenide material. The changed properties of the chalcogenide material may alter the threshold voltage of the memory cell. The threshold voltages of a neural memory (multiple memory cells) of a neural memory unit may be interpreted as a weight as a result of learning in a neural memory unit. The host 102 and/or a portion or the entire memory device 103 can generate and/or receive a learning algorithm. The learning algorithm is an algorithm that can be used in machine learning to help the neural memory unit imitate (e.g., mimic, emulate, etc.) neuro-biological architectures.

A learning algorithm can include variables of a learning event. A learning event can be a quantity of pulses of voltage values, a magnitude of voltage values (e.g., above or sub-threshold voltages), and/or a length of time a pulse is applied to be applied to memory cells (e.g., variable resistance memory cells) of a neural memory unit. A neural memory unit controller (e.g., the controller circuitry 105) can apply the learning algorithm to the array to attempt to elicit a learning event from the variable resistance memory cells of the neural memory unit.

Figure 2:
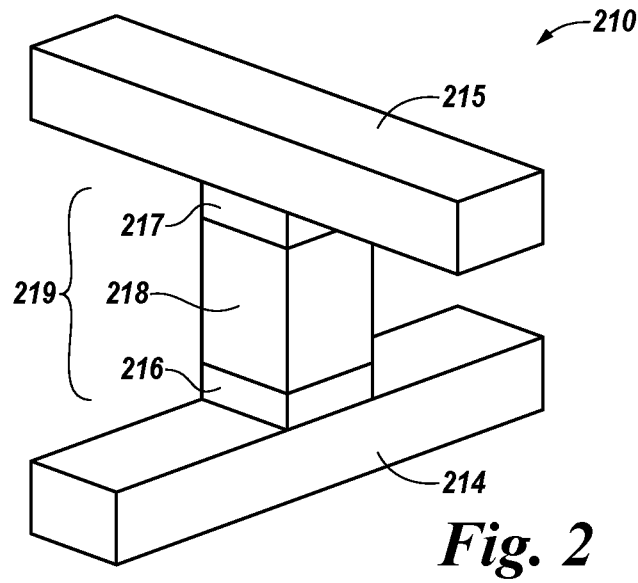
FIG. 2 is a block diagram of an SSM cell in accordance with a number of embodiments of the present disclosure.

FIG. 2 is a block diagram of an SSM cell in accordance with a number of embodiments of the present disclosure. FIG. 2 includes an SSM cell 219 that is part of a memory array 210. Although the memory array 210 only shows a single memory cell 219, the memory array 210 is analogous to memory array 110 in FIG. 1 and may include more memory cells, sense lines, and access lines that those shown herein. The memory array 210 may also include a sense line 215 and an access line 214.

Figure 3:
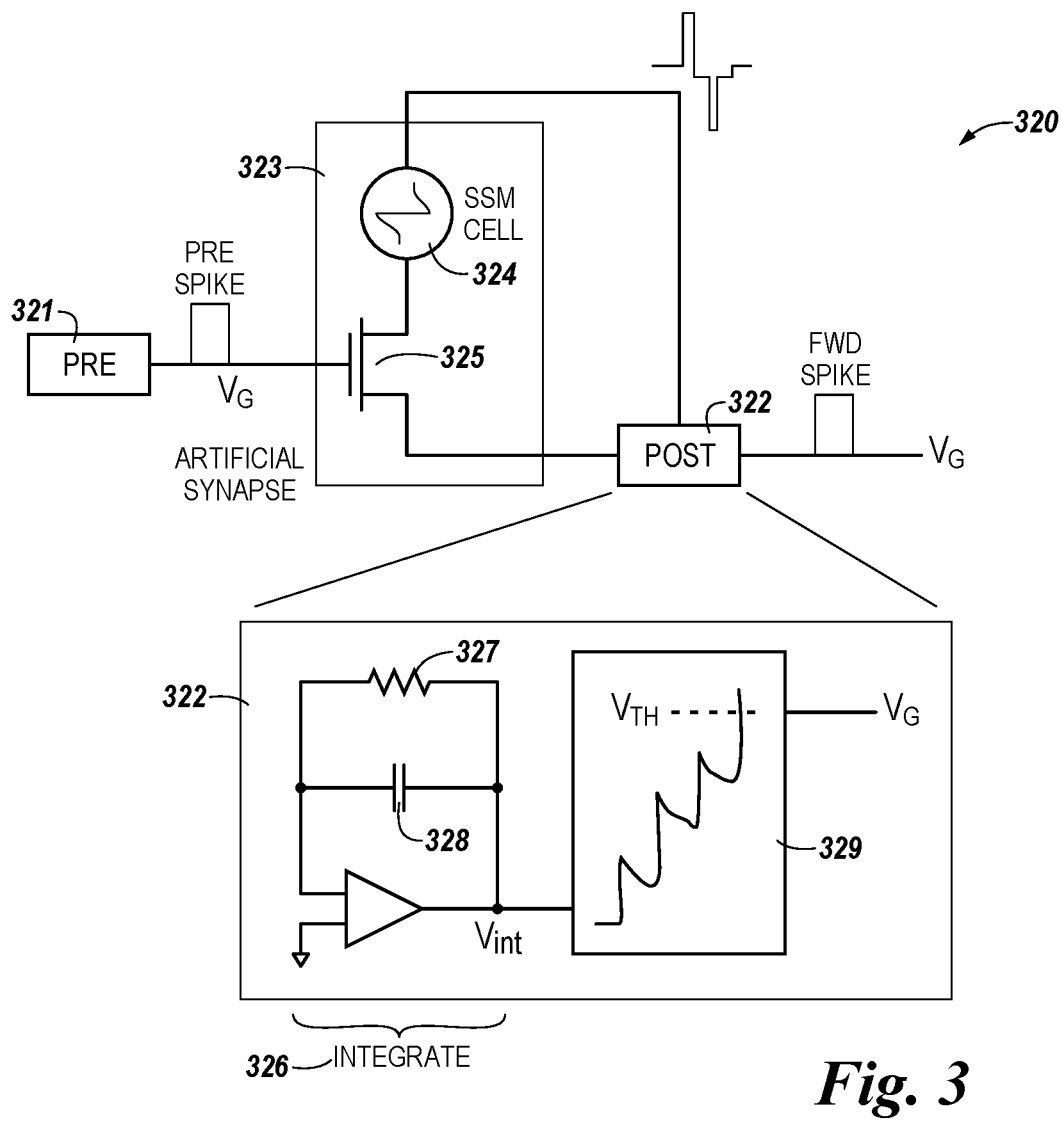
FIG. 3 is a block diagram of an artificial synapse in accordance with a number of embodiments of the present disclosure.

In some cases, the memory cell 219 can be an SSM cell and can include a first electrode 216, a chalcogenide material 218, and a second electrode 217. The electrodes 216 and 217 can also be referred to as a bottom electrode (BE) and a top electrode (TE), respectively. In some embodiments, signal lines (e.g., access line 214 and sense line 215 of FIG. 1) may include an electrode layer (e.g., a conformal layer), in lieu of electrodes 216 or 217 and thus may comprise multilayered access lines. In such embodiments, the electrode layer of the signal lines may interface with a memory material (e.g., chalcogenide material 218). In some embodiments, signal lines may directly interface with a memory material (e.g., chalcogenide material 218) without an electrode layer or an electrode in-between. The chalcogenide material 218 is shown in FIG. 3 as a storage device (SD).

The architecture of memory array 210 may in some cases be referred to as an example of a cross-point architecture, as the memory cell 219 may be formed at a topological cross-point between the access line 216 and the sense line 217 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures.

A DRAM memory array may use a transistor, which is a three-terminal device, as the selection component for each memory cell, and thus a DRAM memory array comprising a given number of memory cells may have a larger memory cell area compared to a memory array with a cross-point architecture comprising the same number of memory cells. While the example of FIG. 2 shows 1 level of a memory array (e.g., a memory deck), other configurations may include any number of decks. In some embodiments, one or more of the memory decks may include self-selecting memory cells that include chalcogenide material 218.

Memory cells (e.g., memory cell 219), may be incorporated as part of memory units that may be configured to store values, which may in some cases be or include analog values. In some memory devices, applying an electronic pulse to a chalcogenide material 218 may cause the chalcogenide material 218 to be affected, which may in some cases include changing physical form. The physical forms for some chalcogenide materials 218 include an amorphous state and a crystalline state. The resistance of these physical forms is different, thereby allowing the chalcogenide material 218 to maintain a physical state which may be referred to as storing a logic (e.g., sense a logic and/or an analog value). In some embodiments of memory devices, applying an electronic pulse to a chalcogenide material 218 may not change a phase of the chalcogenide material 218 and the chalcogenide material 218 can remain amorphous. For example, set and reset states may be obtained by applying pulses of different (e.g., opposite) polarity, in some embodiments moreover, the threshold voltage can be modified or tuned by applying voltage pulses of appropriate amplitude and/or polarity.

FIG. 3 is a block diagram of an artificial synapse 323 in accordance with a number of embodiments of the present disclosure. The artificial synapse 323 can be part of an artificial perceptron 320. The artificial synapse 323 can connect a pre-synapse artificial neuron (PRE) 321 to a post-synapse artificial neuron (POST) 322.

The artificial synapse 323 can include an SSM cell 324 and a transistor 325. That is, the artificial synapse 323 includes a hybrid one-transistor one-SSM (1T1SSM) structure. Although a 1T1SSM structure is shown in FIG. 3, other artificial synapse structures can be implemented such as 2T1SSM or 4T1SSM structures, among others. The transistor 325 can include a gate, a first terminal, and a second terminal. The gate can be coupled to a signal line. The signal line can couple the gate of the transistor 325 to the PRE 321. Although the PRE 321 is shown as an artificial neuron, the PRE 321 can also represent a spiking neural network. For example, the PRE 321 can be part of a spiking neural network that provides the PRE spike to the transistor 325.

The SSM cell can have a leakage current having a magnitude less than one picoamp. A feedback signal can have an order of magnitude of hundreds of millivolts. A duration of an initial pulse and an additional pulse of the feedback signal can have an order of magnitude of tens of nanoseconds. An energy consumption associated with causing the chalcogenide material to take one of two states can has an order of magnitude less than one picojoule.

The SSM cell 323 can be coupled to the first terminal of the transistor 325. The leaky-integrate-and-fire circuit 322 can be coupled to the second terminal of the transistor 325.

SSM cells can be variable resistance memory cells and can be arranged into an array (e.g., a neural memory unit) to mimic neuro biological functionality such as learning. The SSM cells include a chalcogenide material that can change a logic state (e.g., set or reset) of the chalcogenide material that is in an amorphous state responsive to a magnitude of voltage. A set state can be conductive (e.g., low-resistance to current flow) and a reset status can be less conductive (e.g., higher resistance to current flow). The threshold voltage change of the chalcogenide material of the self-selecting memory cell can represent a synaptic weight in a neuromorphic memory system. Changes in synaptic weight can represent and/or be interpreted to represent learning and other biological functions.

In various instances, an electrode may couple a memory cell to an access line or a sense line. As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of the memory array 110 of the memory device 103. Thus, the term electrode may refer in some cases to an access line or a sense line, as well as in some cases to an additional conductive element employed as an electrical contact between an access line and a memory cell.

In some embodiments, a memory cell may comprise a chalcogenide material positioned between a first electrode and a second electrode. The first electrode may couple the chalcogenide material to an access line, and the second electrode couple the chalcogenide material to a sense line. The first electrode and the second electrode may be the same material (e.g., carbon) or different material. In other embodiments, a memory cell may be coupled directly with one or more access lines, and electrodes other than the access lines may be omitted.

Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Operations such as read and write operations may be performed on memory cells by activating or selecting access lines and sense lines. Activating or selecting an access line or a sense line may include applying a voltage to the respective line. Access lines and sense lines may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the sense line by a selection component. The access line may be connected to and may control the selection component. For example, the selection component may be a transistor and the access line may be connected to the gate of the transistor.

As mentioned, the selection component may be a variable resistance component of a variable resistance memory cell, which may comprise chalcogenide material. Specifically, the variable resistance memory cell can be an SSM cell, comprising a single material (e.g., the chalcogenide material) which can serve as both a selection component and a storage component for the memory cell. Activating the access line may result in an electrical connection or closed circuit between the logic storing device of the memory cell and its corresponding sense line. The sense line may then be accessed to either read or write the memory cell. Upon selecting a memory cell, the resulting signal may be used to determine the stored logic state. In some cases, a first logic state may correspond to no current or a negligibly small current through the memory cell, whereas a second logic state may correspond to a finite current. In some cases, a memory cell may include a self-selecting memory cell having two terminals and a separate selection component may be omitted. As such, one terminal of the self-selecting memory cell may be electrically connected to an access line and the other terminal of the self-selecting memory cell may be electrically connected to a sense line.

The chalcogenide material of the memory cell may remain in an amorphous state during the access operation. In some cases, operating the memory cell may include applying various shapes of programming pulses to the memory cell to determine a particular threshold voltage of the memory cell that is, a threshold voltage of a memory cell may be modified by changing a shape of a programming pulse.

A particular threshold voltage of an SSM cell may be determined by applying various shapes of read pulses to the memory cell. For example, when an applied voltage of a read pulse exceeds the particular threshold voltage of the memory cell, a finite amount of current may flow through the memory cell. Similarly, when the applied voltage of a read pulse is less than the particular threshold voltage of the memory cell, no appreciable amount of current may flow through the memory cell.

The POST 322 can include a leaky-integrate-and-fire circuit. The leaky-integrate-and-fire circuit can be configured to receive inputs, integrate the inputs, and provide an output (e.g., fire). As used herein, integrating inputs can include combining the inputs such that two separate inputs are combined into a single input. For example, the leaky-integrate-and-fire circuit can receive a plurality of inputs including a first charge and a second charge. The first charge and the second charge can be combined (e.g., integrated) to generate a third charge. The third charge can be a combination of the first charge and the second charge. The integrated charges can degrade (e.g., leak) over time. For example, the charges stored by a capacitor of the leaky-integrate-and-fire circuit can degrade over time. The leaky-integrate-and-fire circuitry can include the integrate circuitry 326. The leaky-integrate-and-fire circuit also shows a graph 329. The integrate circuitry 326 can include a resistor 327 and a capacitor 328. The integrate circuitry 326 can also be referred to a resistor-capacitor (RC) circuit reflective of the resistor 327 and the capacitor 328. The capacitor 328 can store charges such that charges that are received at the capacitor 328 can be combined. The capacitor 328 can provide a combined charge to circuitry (not shown) configured to provide a forward spike and/or a feedback signal. Over time, the charge stored by the capacitor 328 can degrade (leak). The resistor 327 can provide a resting potential of the leaky-integrate-and-fire circuit which describes.

The feedback signal and/or the forward spike can be provided responsive to the combined charge reaching a threshold. Graph 329 shows that the combined charge may increase and degrade over time as charges are accumulated at the capacitor 328. The graph 329 also shows the combined charge reaching a threshold such that the feedback signal and/or the forward spike are provided by the artificial synapses 322

In some examples, the leaky-integrate-and-fire circuit can also provide feedback signals to the artificial synapse 323. The integrate circuitry 326 can receive a plurality of different charges from a plurality of different artificial synapses including the artificial synapse 323. The integrate circuitry 326 can combine the plurality of different voltages into a single voltage which is referred to as Vint. Although FIG. 3 shows the artificial synapse 323 as providing a voltage to the POST 322, the POST 322 can receive multiple voltages from multiple artificial synapses 323.

The POST 322 can comprise a comparator which can comprise circuitry configured to compare two voltages. In response to Vint exceeding a threshold voltage ($V_{TH}$) of the comparator, the POST 322 can provide a feedback signal to the artificial synapse 323. The feedback signal can include two pulses. A first pulse delivers a positive field across the SSM cell 323. A second pulse delivers a negative field across the SSM cell 323.

The specific shape of the feedback signal can result in a change of the resistance of the SSM cell. The resistance of the SSM cell can depend on a time delay between a signal provided by the PRE 321 and a signal (e.g., feedback signal) provided by the POST 322. The shape of the feedback signal and its influence on the resistance of the SSM cell can be in agreement with a spike-timing-dependent plasticity (STDP) protocol. As such, the STDP protocol dictates that if a signal (e.g., pre spike) provided by the PRE 321 to the POST 322 tends to occur immediately before the feedback signal of the POST 322, then future signals provided by the PRE 321 are made stronger. The STDP protocol also dictates that if a signal provided by the PRE 321 tends to occur immediately after the feedback signal, then future signals provided by the PRE 321 are made weaker. The strength of the signal provided by the PRE 321 is dictated by the resistivity of the SSM cell. For example, a weak resistivity of the SSM cell provides for a strong signal provided by the PRE 321 while a strong resistivity of the SSM cell provides for a weak signal provided by the PRE 321. As used herein, a signal provided by the PRE 321 can include a signal provided by the PRE 321 to the transistor 325 and/or a signal provided by the transistor 325 to the POST 322

A high resistivity of the SSM cell 323 provides for a low voltage which defines a reset state. A low resistivity of the SSM cell 323 provides for a high voltage which defines a set state of the SSM cell 323.

The POST 322 can hold the TE of the SSM cell 324 at a constant voltage. The signal provided by the PRE 321 to the gate of the transistor 325 can activate the transistor 325. The signal provided by the PRE 321 can have a voltage VG which activates the transistor 325. The SSM cell 323 can provide a charge to the POST 322 based on the activation of the transistor 325, the constant charge provided by the POST 322, and the resistivity of the SSM cell 324. For example, the charge provided to the POST 322 can depend on the resistance of the SSM cell 323. The SSM cell 323 can provide a charge to the first terminal of the transistor 325. Based on being activated, the transistor 325 can provide the charge received by the first terminal through the second terminal.

Depending on the time difference between the signal provided by the PRE 321 (e.g., pre spike) and the signal provided by the POST (e.g., feedback spike), the feedback spike can induce LTP or LTD in the SSM cell 324. The feedback signal can include a positive field and a negative field. The feedback signal can set the resistance of the SSM cell 324. The resistance can also represent a weight of the SSM cell such that the weight is combined with the PRE spike, provided by the PRE 321, to determine a voltage provided to the POST 322.

Figure 4:
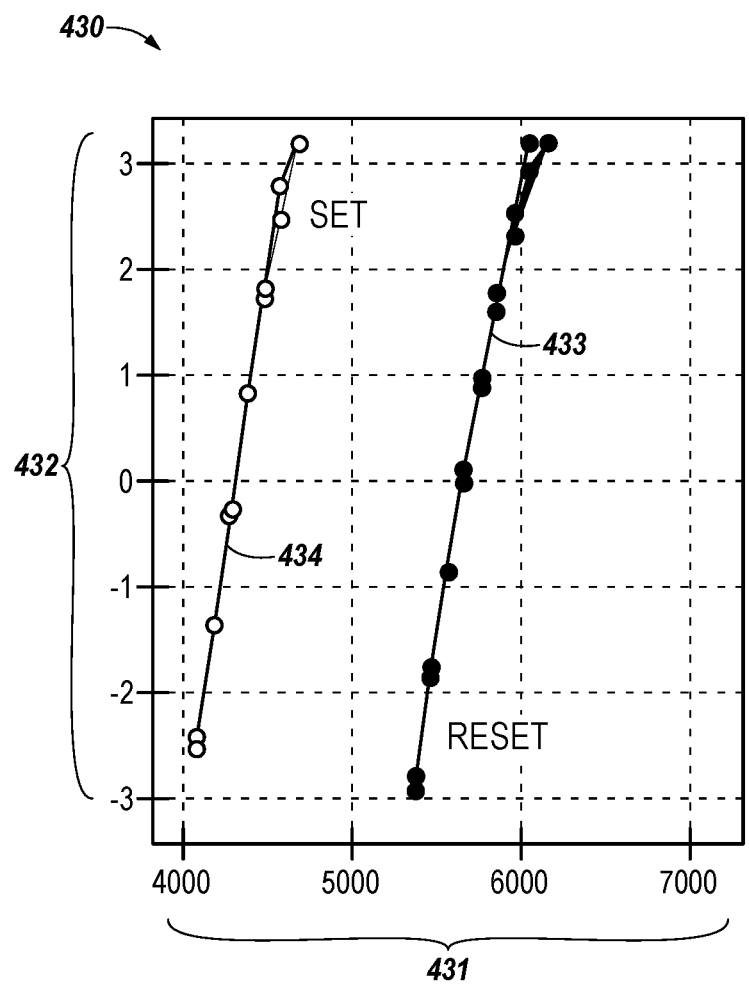
FIG. 4 is a block diagram of set and reset distribution of an array of SSM cells in accordance with a number of embodiments of the present disclosure.

FIG. 4 is a block diagram of set and reset distribution of an array of SSM cells in accordance with a number of embodiments of the present disclosure. The feedback signal described in FIG. 3 induces the set transition and the reset transition.

The set transition can describe the SSM cell as having a high resistance. An SSM cell having a high resistance can provide a low charge to the POST. The reset transition can describe the SSM cell as having a low resistance. An SSM cell having a low resistance can provide a high charge to the POST.

As such, the x-axis 431 of the graph 430 represents the threshold voltage of the SSM cell in millivolts. The y-axis 432 of the graph 430 represents a statistical deviation represented by standard deviations (sigma) from zero.

Figure 5:
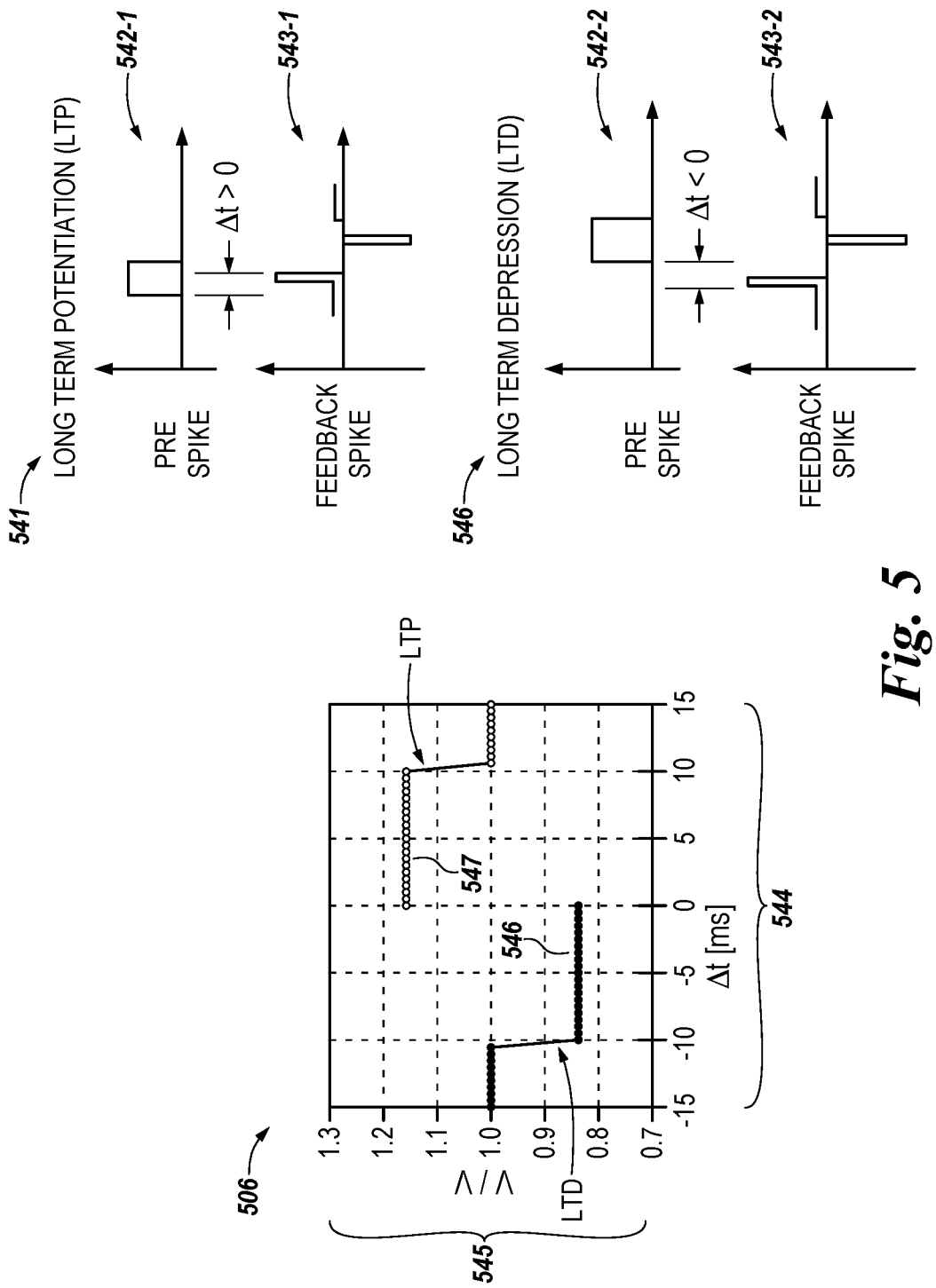
FIG. 5 is a block diagram of long term potentiation (LTP) and long term depression (LTD) for SSM cells in accordance with a number of embodiments of the present disclosure.

FIG. 5 is a block diagram of LTP 541 and LTD 546 for SSM cells in accordance with a number of embodiments of the present disclosure. LTP 541 can be a result of a positive time delay between the PRE spike and the feedback spike. The LTD 546 can be a result of a negative time delay between the PRE spike and the feedback spike.

A negative time delay can be characterized by the providing of the feedback spike after the PRE spike is provided. The positive time delay can be characterized by the providing of the feedback spike before the PRE spike is provided.

For example, if the PRE spike 542-1 is provided before the feedback spike 543-1 is provided, the feedback signal provided by the POST can induce the LTP 541 in the SSM cell. That is, the feedback signal can induce a low resistivity in the corresponding SSM cell such that the signals provided by the SSM cell are stronger than if the SSM cell had a high resistivity. If the PRE spike 542-2 is provided after the feedback spike 543-2 is provided, the feedback signal provided by the POST can induce the LTD 546 in the SSM cell. That is, the feedback signal can induce a high resistivity in the corresponding SSM cell such that the signals provided by the SSM cell are weaker than if the SSM cell had a low resistivity.

Both the feedback spikes 543-1 and 543-2 are shown as having a positive field and a negative field. The positive time delay and the negative time delay can be calculated based on the positive field of the feedback signal. In some examples, the time delays can be calculated from the start of the positive field or the end of the positive field. The time delay can be measured from the reference point of the PRE spike. For example, the time after the PRE spike has been issued is considered positive. The time prior to the issuing of the PRE spike is considered negative.

FIG. 5 also shows a graph 506. The graph 506 comprises an x-axis showing a time delay in milliseconds (ms). The y-axis of the graph 506 shows a voltage. Graph 506 shows that the voltage 547 provided by an artificial synapse increases if the feedback signal provided to the artificial synapse induces LTP. Graph 506 also shows that the voltage 546 provided by an artificial synapse decreases if the feedback signal provided to the artificial synapse induces LTD. However, if the time difference between the PRE spike and the feedback spike is greater than a first threshold, then the feedback signal provided to the artificial synapse may not induce either LTP or LTD and may remain unchanged. If the time difference between the PRE spike and the feedback spike is less than a second threshold, then the feedback signal provided to the artificial synapse may not induce either LTP or LTD and may remain unchanged.

Figure 6:
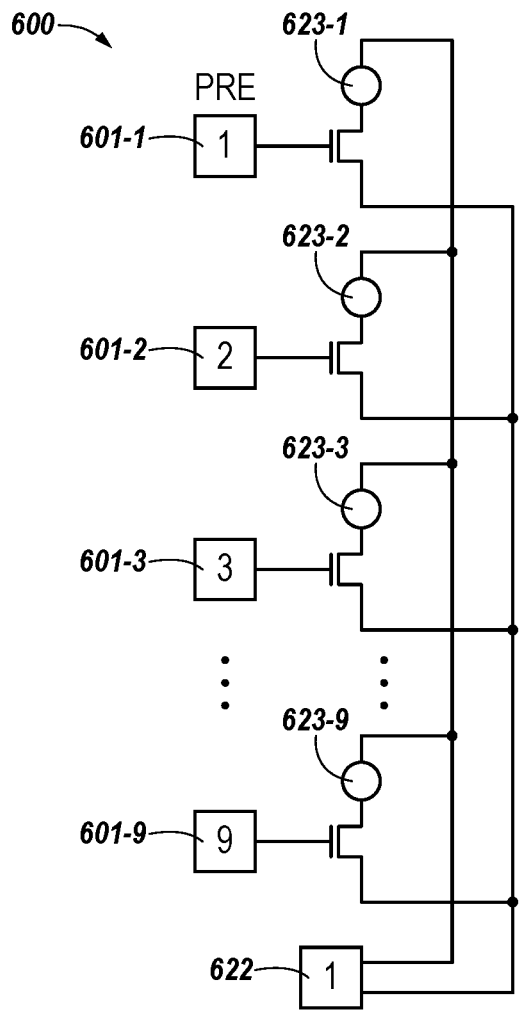
FIG. 6 is a block diagram of pre-synaptic artificial neurons (PRE), post-synaptic artificial neurons (POST), and artificial synapses in accordance with a number of embodiments of the present disclosure.

FIG. 6 is a block diagram of PREs 601-1, 601-2, 601-3, . . . , and 601-9, a POST 622, and artificial synapses 623-1, 623-2, 623-3, . . . , 623-9 in accordance with a number of embodiments of the present disclosure. The PREs 601-1, 601-2, 601-3, . . . , and 601-9, referred to as PRE 601 can be coupled to the POST 622 through the artificial synapses 623-1, 623-2, 623-3, . . . , 623-9. For example, the PRE 601-1 is coupled to the artificial synapse 623-1, the PRE 601-2 is coupled to the artificial synapse 623-2, the PRE 601-3 is coupled to the artificial synapse 623-3, . . . , and the PRE 601-9 is coupled to the artificial synapse 623-9.

The PREs 601, the artificial synapses 623 and the POST 622 can comprise a neural network 600. Although the neural network 600 has been simplified in FIG. 6, the neural network 600 can include more or less, PRE, artificial synapses, and/or POST than those shown herein.

The POST 622 can receive a plurality of charges from the artificial synapses 623. The POST 622 can integrate the plurality of charges into a single charge. Responsive to the integrated charges exceeding a threshold, the POST 622 can provide a POST spike and can generate and provide a unique feedback signal to each of the artificial synapses 623 to update the weight stored in the artificial synapses 623.

The feedback signal can change the conductivity of the chalcogenide material that is included in the artificial synapses 623. The feedback signal can make an SSM cell included in the artificial synapses 623 more or less conductive. The conductivity of the SSM cell can reflect a weight of the artificial synapses 623.

The PRE 601 can receive an input and may provide a PRE spike based on the input. The weights saved by the artificial synapses 623 may be the result or output of the neural network 600. Although the POST spike may appear to be the logical result of the network, the POST spike can be used to update the weights of the artificial synapses 623 such that the artificial synapses 623 can be used to represent the result of the neural network 600. The artificial synapses 623 can be read given that the artificial synapses 623 comprise SSM cells.

For example, if the artificial synapses 623 are in a reset state (e.g., not conductive), then the state of the SSM cells hosted by the artificial synapses 623 can be a logical 0-bit. If the artificial synapses 623 are in a set state, then the state of the SSM cells hosted by the artificial synapses 623 can be a logical 1-bit. The reset state represents a 0-bit and the set state represents a 1-bit. However, the reset state and the set state can represent other bits or logical states of the SSM cells. The logical states of the artificial synapses 623 can be translated to a color, for example, in a pattern learning example.

Figure 7:
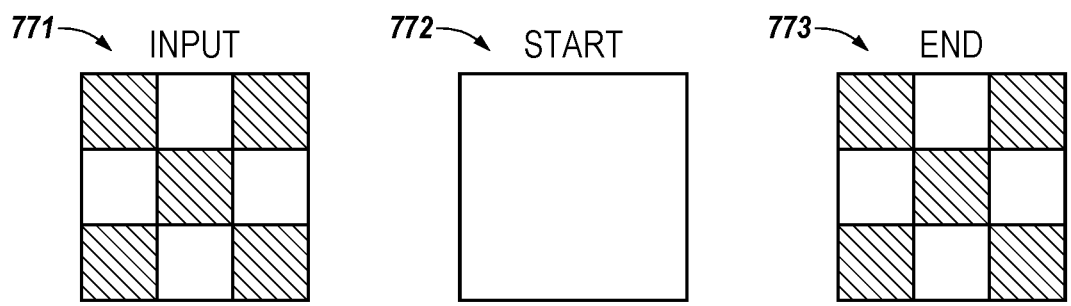
FIG. 7 is a block diagram of an input and an output of a neural network and a starting state of the neural network in accordance with a number of embodiments of the present disclosure.

FIG. 7 is a block diagram of an input 771 and an output 773 of a neural network and a starting state of the neural network in accordance with a number of embodiments of the present disclosure. The input 771 can include an image divided into nine segments. Each of the nine segments can, for example, represent a pixel of an image such that the image is comprise of nine pixels or nine segments.

Each of the segments can have one of two values. For example, each of the segments can have first value representing a first color or second value representing a second color. The colors of the segments of the image can be assigned a logical value such as a 1-bit or a 0-bit. The logical values of the image can be provided to the PRE as input. The input 771 reflects an X-pattern. The X-pattern is shown as segments of the input having a logical 1-bit value while the rest of the input 771 is shown as segments having a 0-bit value.

The starting state 772 of the neural network can be interpreted as an image wherein each of the segments of the image comprise a same color/logical state. Each of the logical states of the neural network can be stored in the artificial synapses. The artificial synapses can store the logical states in the SSM cells. For example, all of the SSM cells that are hosted by the artificial synapses may have a reset state.

The input can be provided to the neural network along with random noise. The input and the random noise can be provided randomly. As the learning takes place, responsive to the feedback signals provided by the POST, the weights (e.g., conductivity) of the artificial synapses can change to mirror the input 771. The weights of the artificial synapses can be read to generate the output 773. Learning can take place unsupervised. That is, learning can take place without processing an expected result.

Figure 8:
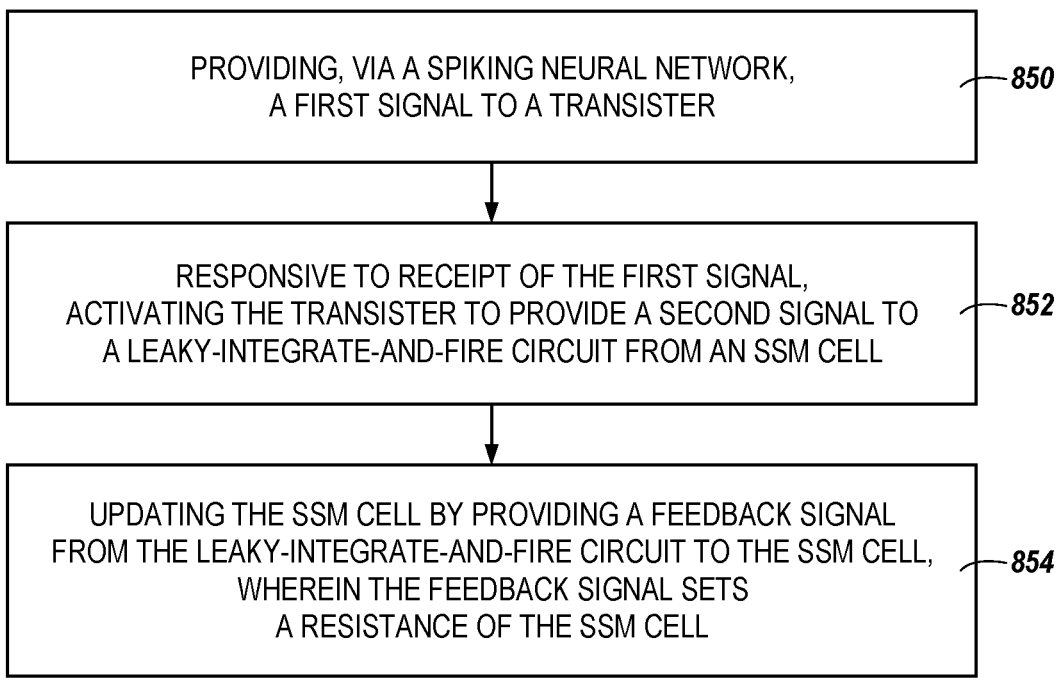
FIG. 8 illustrates an example flow diagram of a method for implementing artificial synapses utilizing an SSM cell in accordance with a number of embodiments of the present disclosure.

FIG. 8 illustrates an example flow diagram of a method for supplementing AI processing in memory in accordance with a number of embodiments of the present disclosure. At 850 a spiking neural network can provide a first signal to the transistor of an artificial synapse. The first signal can also be referred to as a PRE spike. At 852, responsive to receipt of the first signal, the transistor can be activated to provide a second signal to the a leaky-integrate-and-fire circuit from an SSM cell. Activating the transistor can provide a conductive path from the SSM cell to the leaky-integrate-and-fire circuit.

Providing a conductive path from the SSM cell to the leaky-integrate-and-fire circuit can allow for the SSM cell to deliver a voltage to the leaky-integrate-and-fire circuit. The magnitude of the voltage provided by the SSM cell may be dependent on a weight stored by the SSM cell in the form of resistance of the chalcogenide material comprising the SSM cell. For example, a first voltage can be provided to the SSM cell and a second voltage can be provided from the SSM cell to the leaky-integrate-and-fire circuit, where the difference between the first voltage and the second voltage can be attributed to the resistance (weights) of the SSM cell.

At 854, the leaky-integrate-and-fire circuit can provide a feedback signal to update the SSM cell. The feedback signal can set a resistance of the SSM cell. The feedback signal can induce a set state in the SSM cell responsive to the first signal being provided before a feedback signal provided by the leaky-integrate-and-fire circuit. The feedback signal can be provided by the leaky-integrate-and-fire circuit responsive to an integration of the second signal being greater than a threshold voltage compared at the leaky-integrate-and-fire circuit. The feedback signal can induce a reset state in the SSM cell responsive to the first signal being provided after the feedback signal.

In some examples, a burst mode can be utilized to reduce the energy utilized by a neural network. A burst mode can be utilized to update the plurality of SSM cells responsive to integrating the voltages provided by the artificial synapses such that a threshold voltage is met.

In a burst mode, integration of the voltages provided by the artificial synapses is induced utilizing a voltage threshold that is provided to the POST utilizing bursts. The voltage threshold can be provided utilizing bursts instead of a direct current (DC) voltage. The pulses save energy due to the intermittent delivery of a current POST to be utilized as a threshold voltage.

Figure 9:
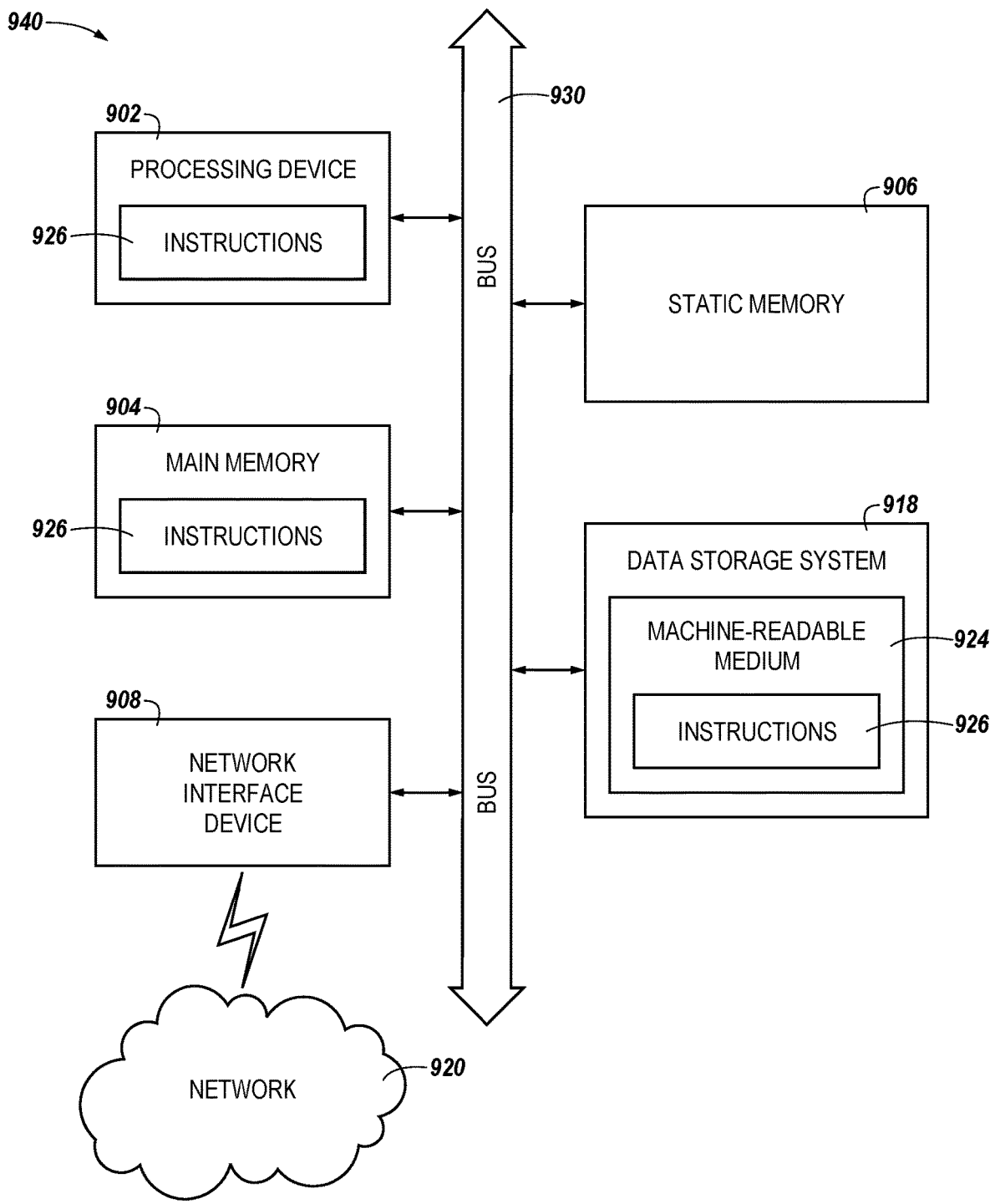
FIG. 9 illustrates an example machine of a computer system within which a set of instructions, for causing the machine to perform various methodologies discussed herein, can be executed.

FIG. 9 illustrates an example machine of a computer system 940 within which a set of instructions, for causing the machine to perform various methodologies discussed herein, can be executed. In various embodiments, the computer system 940 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 940 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 940 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 940, the main memory 904 and the processing device 902 also constituting machine-readable storage media.

In one embodiment, the instructions 926 include instructions to implement functionality corresponding to the host 102 and/or the memory device 103 of FIG. 1. While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a transistor comprising a gate, a first terminal, and a second terminal;
a self-selecting memory (SSM) cell coupled to the first terminal;
a signal line coupled to the gate; and
a leaky-integrate-and-fire circuit coupled to the SSM cell and to the second terminal;
wherein the transistor is configured to:
receive, at the gate, via a first portion of a spiking neural network (SNN), a first signal and wherein the transistor is part of the SNN;
responsive to receipt of the first signal, provide a second signal to a leaky-integrate-and-fire circuit from a self-selecting memory (SSM) cell that is part of the SNN;
wherein the leaky-integrate-and-fire circuit is configured to provide a feedback signal to the SSM cell to set a resistance of the SSM cell responsive to a threshold quantity of pulses being applied to the gate from the signal line;
wherein the SSM cells comprises a chalcogenide material that has the resistance that represents a weight of a spiking neural network;
wherein the SSM cell is set responsive to a third signal being provided by the leaky-integrate-and-fire circuit as input to a different transistor after the first signal is provided to the transistor;
wherein the resistance of the SSM cell is dependent on a time difference between a latest of the threshold quantity of pulses and an initial pulse of the feedback signal; and
wherein the leaky-integrate-and-fire circuit is further configured to provide a forward signal to a second portion of the SNN.

2. The apparatus of claim 1, wherein the signal line is coupled to the spiking neural network, representing a pre-synapse artificial neuron configured to collect sensorial stimuli;
wherein the spiking neural network is configured to provide the threshold quantity of pulses to the gate corresponding to the collected sensorial stimuli;
wherein the transistor and the SSM cell represent an artificial synapse; and
wherein the leaky-integrate-and-fire circuit represents a post-synapse artificial neuron that is configured to update a synaptic weight of the artificial synapse.

3. The apparatus of claim 1, wherein the leaky-integrate-and-fire-circuit comprises a comparator, having a threshold voltage, coupled to a resistor-capacitor (RC) circuit.

4. The apparatus of claim 1, wherein the SSM cell includes the chalcogenide material as a switching device and a storage device.

5. The apparatus of claim 4, wherein the SSM cell comprises a top electrode, a storage device (SD), and a bottom electrode;
wherein the SD comprises the chalcogenide material;
wherein the top electrode is coupled to the leaky-integrate-and-fire circuit; and
wherein the bottom electrode is coupled to the first terminal.

6. The apparatus of claim 1, wherein the resistance is further based on a quantity of threshold quantity of pulses.

7. The apparatus of claim 1, wherein the resistance is further based on a magnitude of the threshold quantity of pulses.

8. The apparatus of claim 1, wherein the resistance is further based a length of time the threshold quantity of pulses are applied to the SSM cell.

9. The apparatus of claim 1, wherein the feedback signal induces a set transition of the SSM cell responsive to the latest of the threshold quantity of pulses being provided before the initial pulse of the feedback signal.

10. The apparatus of claim 1, wherein the feedback signal induces a reset transition of the SSM cell responsive to the latest of the threshold quantity of pulses being provided after the initial pulse of the feedback signal.

11. The apparatus of claim 1, wherein a shape of the feedback signal affects resistance of the SSM cell.

12. The apparatus of claim 1, further comprising a plurality of transistors coupled to the SSM cell.

13. A method comprising:
providing, via a first portion of a spiking neural network, a first signal to a transistor that is part of the spiking neural network (SNN);
responsive to receipt of the first signal, activating the transistor to provide a second signal to a leaky-integrate-and-fire circuit from a self-selecting memory (SSM) cell that is part of the SNN; and
updating the SSM cell by providing a feedback signal from the leaky-integrate-and-fire circuit to the SSM cell, wherein the feedback signal sets a resistance of the SSM cell;
wherein the SSM cell is set responsive to a third signal being provided by the leaky-integrate-and-fire circuit as input to a different transistor after the first signal is provided to the transistor; and
providing a forward signal to a second portion of the SNN from the leaky-integrate-and-fire circuitry.

14. The method of claim 13, wherein the first portion of the SNN is a pre-synapse artificial neuron.

15. The method of claim 13, wherein the SSM cell is reset responsive to the third signal being provided by the leaky-integrate-and-fire circuit before the first signal is provided to the transistor.

16. An apparatus comprising:
a plurality of spiking neural networks configured to provide a plurality of first signals to a plurality of transistors;
the plurality of transistors coupled to a plurality of self-selecting memory (SSM) cells, and configured to provide a plurality of second signals to a leaky-integrate-and-fire circuit responsive to an activation of the plurality of transistors via the plurality of first signals;
the leaky-integrate-and-fire circuit configured to:
generate a different feedback signal for each of the SSM cells; and
the plurality of SSM cells comprising a chalcogenide material that has a resistance that represents weights of the plurality of spiking neural;
wherein the resistance of the plurality of SSM cells is dependent on a time difference between a corresponding latest of the first plurality of signals and a corresponding different feedback signal;
wherein the SSM cells are set responsive to a plurality of third signals being provided by the leaky-integrate-and-fire circuit as input to different transistors from the plurality of transistors after the plurality of first signals are provided to the plurality of transistors; and
wherein the leaky-integrate-and-fire circuit is further configured to provide forward signals to different portions of the SNN.

17. The apparatus of claim 16, wherein the leaky-integrate-and-fire circuit is configured to receive pulses while in burst-mode, wherein the threshold describes a quantity of pulses.

18. The apparatus of claim 16, wherein the leaky-integrate-and-fire circuit is further configured to compare the plurality of second signals to the threshold utilizing the pulses.

19. The apparatus of claim 16, wherein the resistance is based on a shape of the different feedback signals.

20. The apparatus of claim 16, wherein the leaky-integrate-and-fire circuit is further configured to update each of the SSM cells based on time differences between a respective first signal from the plurality of first signals and a respective second signal from a plurality of feedback signals provided by the leaky-integrate-and-fire circuit.

\* \* \* \* \*